US009184708B2

(12) United States Patent
Choi et al.

(10) Patent No.: US 9,184,708 B2
(45) Date of Patent: Nov. 10, 2015

(54) AUDIO SIGNAL PROCESSING METHOD AND AUDIO SIGNAL PROCESSING APPARATUS THEREFOR

(75) Inventors: Jung-min Choi, Hwaseong-si (KR); Jae-yong Cho, Bucheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 608 days.

(21) Appl. No.: 13/561,798

(22) Filed: Jul. 30, 2012

(65) Prior Publication Data

US 2013/0028448 A1    Jan. 31, 2013

(30) Foreign Application Priority Data

Jul. 29, 2011    (KR) .................. 10-2011-0076168

(51) Int. Cl.
*H03F 3/217*    (2006.01)
*H03M 3/00*    (2006.01)

(52) U.S. Cl.
CPC .............. *H03F 3/2173* (2013.01); *H03F 3/217* (2013.01); *H03M 3/366* (2013.01); *H03M 3/458* (2013.01)

(58) Field of Classification Search
CPC . H03F 3/217; H03F 2200/331; H03F 3/2173; H03M 7/3006; H03M 7/3031
USPC ................. 381/120; 330/10, 250–253, 207 A
See application file for complete search history.

(56) References Cited

U.S. PATENT DOCUMENTS

| | | | |
|---|---|---|---|
| 5,012,244 A | 4/1991 | Wellard et al. | |
| 5,745,061 A | 4/1998 | Norsworthy et al. | |
| 6,426,714 B1 | 7/2002 | Ruha et al. | |
| 6,600,789 B1 | 7/2003 | Lipasti et al. | |
| 7,257,164 B2 | 8/2007 | Magrath | |
| 7,525,465 B1 | 4/2009 | Elwan et al. | |
| 2004/0239416 A1* | 12/2004 | Smiley et al. | 330/10 |
| 2005/0007267 A1 | 1/2005 | Zogakis et al. | |
| 2005/0030093 A1 | 2/2005 | Olson et al. | |
| 2009/0066549 A1* | 3/2009 | Thomsen et al. | 341/143 |
| 2013/0028448 A1* | 1/2013 | Choi et al. | 381/120 |

FOREIGN PATENT DOCUMENTS

| | | |
|---|---|---|
| CN | 1599257 A | 3/2005 |
| CN | 101610085 A | 12/2009 |
| JP | 7-015281 A | 1/1995 |

(Continued)

OTHER PUBLICATIONS

Communication from the Japanese Patent Office dated Nov. 11, 2014, in a counterpart Japanese application No. 2014-523836.

(Continued)

*Primary Examiner* — Vivian Chin
*Assistant Examiner* — David Ton
(74) *Attorney, Agent, or Firm* — Sughrue Mion, PLLC

(57) ABSTRACT

An audio signal processing apparatus and method are provided. The apparatus includes a stability determiner and a sigma-delta modulator. The stability determiner divides a frequency band of an input audio signal into one or more sub-frequency bands, compares a level of the input audio signal for each of the sub-frequency bands with a threshold for the sub-frequency band, and generates a stability determination signal according to a result of the comparison. The sigma-delta modulator sigma-delta modulates the input audio signal according to the stability determination signal, and outputs a modulation signal.

26 Claims, 10 Drawing Sheets

(56) References Cited

FOREIGN PATENT DOCUMENTS

| JP | 7-131881 A | 5/1995 |
|---|---|---|
| JP | 11-112351 A | 4/1999 |
| JP | 2005-286846 A | 10/2005 |
| JP | 2007-208376 A | 8/2007 |
| JP | 2008-54099 A | 3/2008 |
| KR | 2001-0012348 A | 2/2001 |

OTHER PUBLICATIONS

International Search Report dated Feb. 15, 2013 issued by the International Searching Authority in counterpart International Application No. PCT/KR2012/005941 (PCT/ISA/210).

Written Opinion dated Feb. 15, 2013 issued by the International Searching Authority in counterpart International Application No. PCT/KR2012/005941 (PCT/ISA/237).

Kiss, et al., "Stable high-order delta-sigma DACs", IEEE Transactions on Circuits and Systems-I: Regular Papers, May 25-28, 2003, 11 pgs.

Communication dated Mar. 3, 2015 issued by the European Patent Office in counterpart Application No. 12820823.8.

Communication issued Jul. 2, 2015, issued by the State Intellectual Property Office of the People's Republic of China in counterpart Chinese Patent Application No. 201280048160.2.

* cited by examiner

AUDIO SIGNAL PROCESSING METHOD AND AUDIO SIGNAL PROCESSING APPARATUS THEREFOR

CROSS-REFERENCE TO RELATED PATENT APPLICATION

This application claims priority to Korean Patent Application No. 10-2011-0076168, filed on Jul. 29, 2011, in the Korean Intellectual Property Office, the disclosure of which is incorporated by reference herein in its entirety.

BACKGROUND

1. Field

Apparatuses and methods consistent with the present disclosure relate to audio signal processing and, more particularly, to audio signal processing of sigma-delta modulation of an input audio signal.

2. Description of the Related Art

Class A, B, C, and Class D amplifiers are used to receive audio signals and output audibly perceptible signals. A Class D amplifier reduces deterioration in amplification efficiency that occur in class A, B, and C amplifiers. The Class D amplifier exhibits higher amplification efficiency than class A, B, and C amplifiers. Thus the Class D amplifier is widely used.

A Class D amplifier is a digital amplifier that modulates analogously input audio signals to produce digital audio signals, and amplifies and output digitally modulated audio signals.

Digital amplifiers have no data conversion loss and achieve amplification efficiency of 100% theoretically and thus are widely used.

Digital amplifiers modulate input audio signals to produce pulse signals and amplify the pulse signals. Sigma-delta modulation may be used to modulate audio signals to produce pulse signals. A modulator using sigma-delta modulation is referred to as a sigma-delta modulator.

A high order sigma-delta modulator may be used to enhance noise shaping.

However, a high order sigma-delta modulator accumulates signal values, which causes a large amount of oscillation to occur as the order of the sigma-delta modulator increases. The occurrence of oscillation may hinder the ability of the sigma-delta modulators to perform modulation operations, and thus an operation stability of sigma-delta modulator may not be secured.

SUMMARY

An aspect of the present disclosure provides an audio signal processing method of securing operation stability during sigma-delta modulation, and an audio signal processing apparatus therefor.

Another aspect of the present disclosure is to provide an audio signal processing method of precisely detecting stability of an input audio signal so as to secure operation stability during sigma-delta modulation, and an audio signal processing apparatus therefor.

Another aspect of the present disclosure is to provide an audio signal processing method of providing an increased signal to noise ratio (SNR) while providing high stability, and an audio signal processing apparatus therefor.

According to an aspect of an exemplary embodiment, there is provided an audio signal processing apparatus including a stability determining unit that compares a level of an input audio signal for each of at least one sub-frequency band with a threshold for the sub-frequency band, and generates a stability determination signal according to a result of the comparison; and a sigma-delta modulation unit that sigma-delta modulates the input audio signal according to the stability determination signal, and outputs a first modulation signal.

Each of the at least one sub-frequency band may have a different threshold which is set for each sub-frequency band as a value in proportion to a frequency value the sub-frequency band.

The apparatus may further include a delay unit that receives the input audio signal, compensates the input audio signal for a time taken to determine stability in the stability determining unit, and outputs the compensated input audio signal to the sigma-delta modulation unit.

The stability determining unit may determine the input audio signal in a sub-frequency band to be unstable if a level of the input audio signal in the sub-frequency band is equal to or greater than the threshold for the sub-frequency band, and may set a level of the stability determination signal to indicate that the input audio signal is unstable.

The stability determining unit may include a detecting unit that divides a frequency band of the input audio signal into the at least one sub-frequency band, and compares the level of the input audio signal for each of the at least one sub-frequency band with the threshold for the sub-frequency band; and an adjusting unit that determines stability of the input audio signal and generates the stability determination signal according to the result of the comparisons.

The sigma-delta modulation unit may include a loop filter that integrates the input audio signal and outputs the integrated input audio signal; and a quantization unit that quantizes the output signal of the loop filter and generates the first modulation signal.

The sigma-delta modulation unit may further include a feedback loop that feeds back the first modulation signal and outputs a first feedback signal; and a summing unit that subtracts the feedback signal from the input audio signal and outputs the subtracted input audio signal.

The detecting unit may include a signal level detecting unit that divides the frequency band of the input audio signal into a plurality of sub-frequency bands, and compares the input audio signal for each of the plurality of sub-frequency bands with the threshold for the sub-frequency band for a period; and a counter unit that accumulates a result of the comparison over the period.

The detecting unit may include a frequency converting unit that converts the input audio signal into a frequency band signal; and a level detecting unit that compares the level of the input audio signal for each of the at least one sub-frequency band with the threshold for the sub-frequency band by using the frequency band signal.

The apparatus may further include a driving signal generating unit that generates at least one driving signal used to control a switching amplifying operation according to the first modulation signal; and a power switching amplifier including at least one switching device that turns on or off in response to a corresponding one of the at least one driving signal, performing the switching amplifying operation, and outputting an amplified audio signal corresponding to the input audio signal by using the at least one switching device, wherein the at least one switching device includes at least one of a gallium nitride (GaN) transistor, a gallium arsenide (GaAs) transistor, and a silicon carbide (SiC) transistor.

The apparatus may further include a feedback loop that outputs a feedback signal obtained by attenuating and delaying the amplified audio signal to the sigma-delta modulation unit in order to compensate for at least one of a delay and a gain of the amplified audio signal.

The stability determining unit may generate the stability determination signal such that at least one of a signal-to-noise ratio (SNR) value and a stability value of the sigma-delta modulation unit is adjusted according to the result of the comparison.

The stability determining unit may generate the stability determination signal in such a way that at least one of a coefficient of a noise transfer function (NTF) of the sigma-delta modulation unit and an order of the sigma-delta modulation unit is adjusted according to the result of the comparison.

The stability determining unit may generate the stability determination signal of a first level if the level of the input audio signal in a sub-frequency band of the at least one sub-frequency band is equal to or greater than the threshold for the sub-frequency band, and generates the stability determination signal of a second level if the level of the input audio signal in the sub-frequency band is less than the threshold for the sub-frequency band.

The sigma-delta modulation unit may receive the stability determination signal of the first level and adjusts at least one of a coefficient of a noise transfer function (NTF) of the sigma-delta modulation unit and an order of the sigma-delta modulation unit such that oscillation that occurs during sigma-delta modulation is reduced.

The sigma-delta modulation unit may receive the stability determination signal of the second level and adjusts at least one of the coefficient of a noise transfer function (NTF) of the sigma-delta modulation unit and an order of the sigma-delta modulation unit such that a signal-to-noise ratio (SNR) value of the sigma-delta modulation unit increases.

According to another aspect of an exemplary embodiment, there is provided an audio signal processing method including dividing a frequency band of an input audio signal into at least one sub-frequency band; comparing a level of the input audio signal for each of the at least one sub-frequency band with a threshold for the sub-frequency band; generating a stability determination signal according to a result of the comparing; performing sigma-delta modulation on the input audio signal according to the stability determination signal; and outputting the sigma-delta modulated signal as a first modulation signal.

BRIEF DESCRIPTION OF THE DRAWINGS

The above and other aspects will become more apparent by describing in detail exemplary embodiments thereof with reference to the attached drawings in which.

DETAILED DESCRIPTION

A sigma-delta modulator performs shaping on a noise component included in an input audio signal by pushing the noise component to outside portion of a frequency band according to the characteristics of a noise transfer function (NTF).

Noise shaping of the NTF is influenced by an order of the sigma-delta modulator. More specifically, the higher the order of the sigma-delta modulator, the closer to the outside portion of the frequency band to which noise is pushed during the noise shaping. Accordingly, the higher the order of the sigma-delta modulator, the higher the signal to noise ratio (SNR).

Furthermore, if a level of an input signal is greater than a specific threshold according to feedback characteristics of the sigma-delta modulator, oscillation occurs during sigma-delta modulation. If oscillation occurs, the sigma-delta modulator does not operate normally, and thus stability of a system deteriorates.

Enhancement of the SNR is inversely proportional to the stability of the system. That is, if a high order sigma-delta modulator is designed to enhance the SNR, the stability of the system deteriorates, which increases a probability of oscillation. Furthermore, if a low order sigma-delta modulator is designed to increase the stability of the system, the SNR is reduced.

An audio signal processing method and an audio signal processing apparatus therefor that secure operation stability during sigma-delta modulation while enhancing a SNR according to exemplary embodiments will now be described more fully with reference to the accompanying drawings, in which exemplary embodiments are shown.

As used herein, expressions such as "at least one of", when preceding a list of elements, modify the entire list of elements and do not modify the individual elements of the list.

Figure 1:
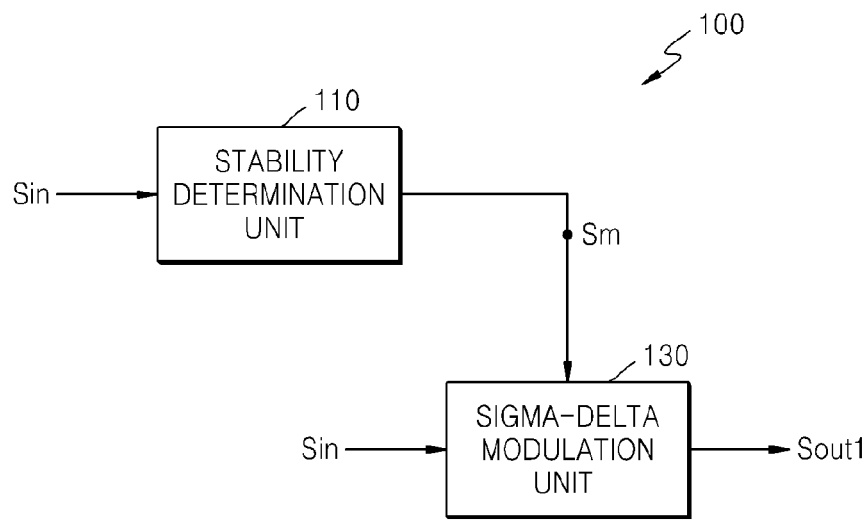
FIG. 1 is a block diagram of an audio signal processing apparatus according to an exemplary embodiment.

FIG. 1 is a block diagram of an audio signal processing apparatus 100 according to an exemplary embodiment.

Referring to FIG. 1, the audio signal processing apparatus 100 of the present exemplary embodiment includes a stability determination unit 110 and a sigma-delta modulation unit 130.

The stability determination unit 110 may divide a frequency band of an input audio signal Sin into at least one sub-frequency band. The stability determination unit 110 compares a level of the input audio signal Sin for the sub-frequency bands with a threshold for the sub-frequency band. The stability determination unit 110 generates a stability determination signal Sm according to a comparison result.

In this regard, the threshold may be a lower limit value of an input audio signal level at which oscillation occurs during sigma-delta modulation. Thus, if a level of the input audio signal Sin is less than the threshold for a sub-frequency band, the input audio signal Sin may be determined as a stable signal. On the other hand, if the level of the input audio signal Sin is equal to or greater than the threshold for the sub-frequency band, the input audio signal Sin may be determined as an unstable signal.

For example, the stability determination unit 110 divides the frequency band of the input audio signal Sin into a number (N) of sub-frequency bands. Each of the N sub-frequency bands has an associated threshold. Thus, for N sub-frequency bands, there are N thresholds. The stability determination unit 110 compares the input audio signal Sin of the first sub-frequency band with a threshold for the first sub-frequency band. Then the stability determination unit 110 compares the input audio signal Sin of the second sub-frequency band with a threshold for the second sub-frequency band, and so forth.

In this regard, the threshold may differ according to coefficients of a noise transfer function (NTF) of the sigma-delta modulation unit 130. More specifically, the characteristics of the NTF, which include pole and zero values of the NTF, may differ according to a design specification of the sigma-delta modulation unit 130. In this regard, values used to determine the characteristics of the NTF, including the pole and zero values of the NTF, may be coefficients of the NTF. Furthermore, if the pole and zero values of the NTF are adjusted, an oscillation degree of the sigma-delta modulation unit 130 may be adjusted. Thus, the threshold may be experimentally optimized and designed in terms of the design specification of the sigma-delta modulation unit 130.

If the level of the input audio signal Sin for a frequency band is equal to or greater than the threshold, the stability determination unit 110 may determine the input audio signal Sin in the frequency band to be unstable.

More specifically, the stability determination unit 110 may generate a signal level of the stability determination signal Sm as a first level if the level of the input audio signal Sin is equal to or greater than the threshold, and may generate the signal level of the stability determination signal Sm as a second level if the level of the input audio signal Sin is less than the threshold.

The sigma-delta modulation unit 130 performs sigma-delta modulation (SDM) on the input audio signal Sin according to the stability determination signal Sm transmitted from the stability determination unit 110 and outputs a first modulation signal Sout1. Accordingly, the first modulation signal Sout1 is generated after being pulse modulated corresponding to the input audio signal Sin.

In this regard, the sigma-delta modulation unit 130 may have an order that may differ according to the number of integrators included in the sigma-delta modulation unit 130. The sigma-delta modulation unit 130 may have an order that varies according to the first modulation signal Sout1 transmitted from the stability determination unit 110.

The audio signal processing apparatus 100 of the present exemplary embodiment divides the frequency band of the input audio signal Sin into at least one sub-frequency band, and separately determines stability of the input audio signal Sin for the at least one sub-frequency band, thereby precisely determining stability of the input audio signal Sin. Accordingly, the SNR for each frequency band may be enhanced as much as possible while the stability of the sigma-delta modulation unit 130 is maintained.

Figure 2:
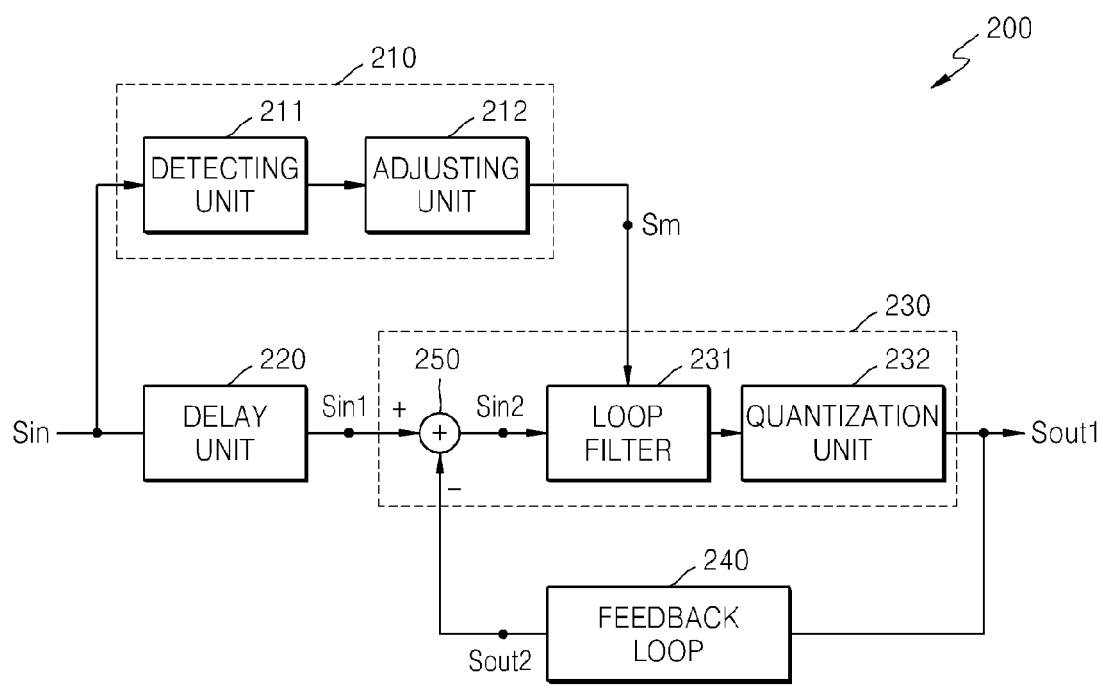
FIG. 2 is a block diagram of an audio signal processing apparatus according to another exemplary embodiment.

FIG. 2 is a block diagram of an audio signal processing apparatus according to another exemplary embodiment.

Referring to FIG. 2, the audio signal processing apparatus 200 may further include at least one of a delay unit 220 and a feedback loop 240, compared to the audio signal processing apparatus 100 of FIG. 1. A stability determination unit 210 and a sigma-delta modulation unit 230 included in the audio signal processing apparatus 200 of FIG. 2 may correspond to the stability determination unit 110 and the sigma-delta modulation unit 130 included in the audio signal processing apparatus 100 of FIG. 1. Thus, redundant descriptions will not be repeated here.

The delay unit 220 may transmit the input audio signal Sin, and compensate for a time taken to determine stability of the input audio signal Sin in the stability determination unit 210. Accordingly, the delay unit 220 outputs the input audio signal Sin for which the time is compensated, to the sigma-delta modulation unit 230.

More specifically, if it takes a time t1 to receive the input audio signal Sin and generate the stability determination signal Sm in the stability determination unit 210, the delay unit 220 may delay the input audio signal Sin by the time t1, and transmit the input audio signal Sin delayed by the time t1 to the sigma-delta modulation unit 230.

The stability determination unit 210 may include a detecting unit 211 and an adjusting unit 212.

The detecting unit 211 divides a frequency band of the input audio signal Sin into at least one sub-frequency band, and compares a level of the input audio signal Sin for each sub-frequency band with a corresponding threshold. That is, the detecting unit 211 may perform N comparison operations if the frequency band of the input audio signal Sin is divided into N sub-frequency bands.

The adjusting unit 212 determines the stability of the input audio signal Sin according to the comparison result of the detecting unit 211 and generates the stability determination signal Sm corresponding to the determination of stability.

The sigma-delta modulation unit 230 may include a loop filter 231 and a quantization unit 232.

The loop filter 231 includes at least one integrator (not shown), and integrates and outputs the input audio signal Sin. The loop filter 231 performs noise shaping on noise included in the input audio signal Sin to push the noise to an outband of a frequency band according to a NTF.

The quantization unit 232 receives a signal output from the loop filter 231, quantizes the received signal, and generates the first modulation signal Sout1 in a pulse signal form.

The sigma-delta modulation unit 230 may further include the feedback loop 240 and a summing unit 250.

The feedback loop 240 feeds back the first modulation signal Sout1 and outputs a feedback signal Sout2.

The summing unit 250 subtracts the first feedback signal Sout2 from the input audio signal Sin and outputs an adjusted input audio signal Sin2 to the loop filter 231. If the audio signal processing apparatus 200 includes the delay unit 220, the summing unit 250 may subtract the first feedback signal Sout2 from a delayed input audio signal Sin1 and output the subtracted signal to the loop filter 231.

If the sigma-delta modulation unit 230 includes the feedback loop 240 and the summing unit 250, the sigma-delta modulation unit 230 may adjust at least one of a gain and a phase of the input audio signal Sin or Sin1 of the sigma-delta modulation unit 230 in view of a gain and a phase of the output signal of the sigma-delta modulation unit 230. Accordingly, the sigma-delta modulation unit 230 may perform precise gain control in accordance with a target gain or a regular maximum output of the audio signal processing apparatus 200.

Figure 3A:
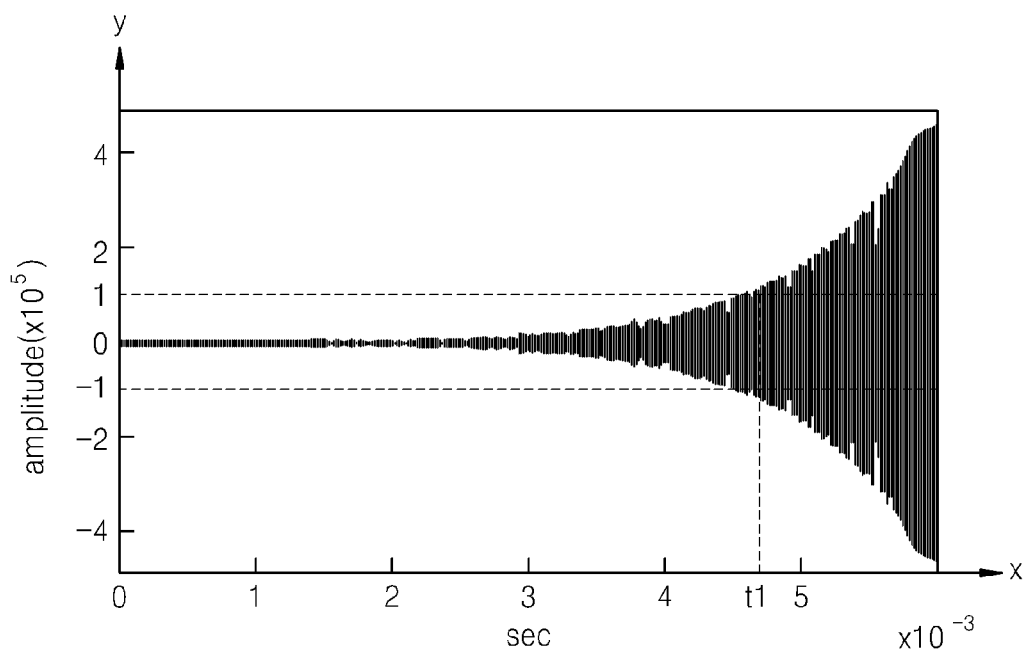
FIGS. 3A and 3B are graphs for explaining oscillation that occurs during sigma-delta modulation.
Figure 3B:
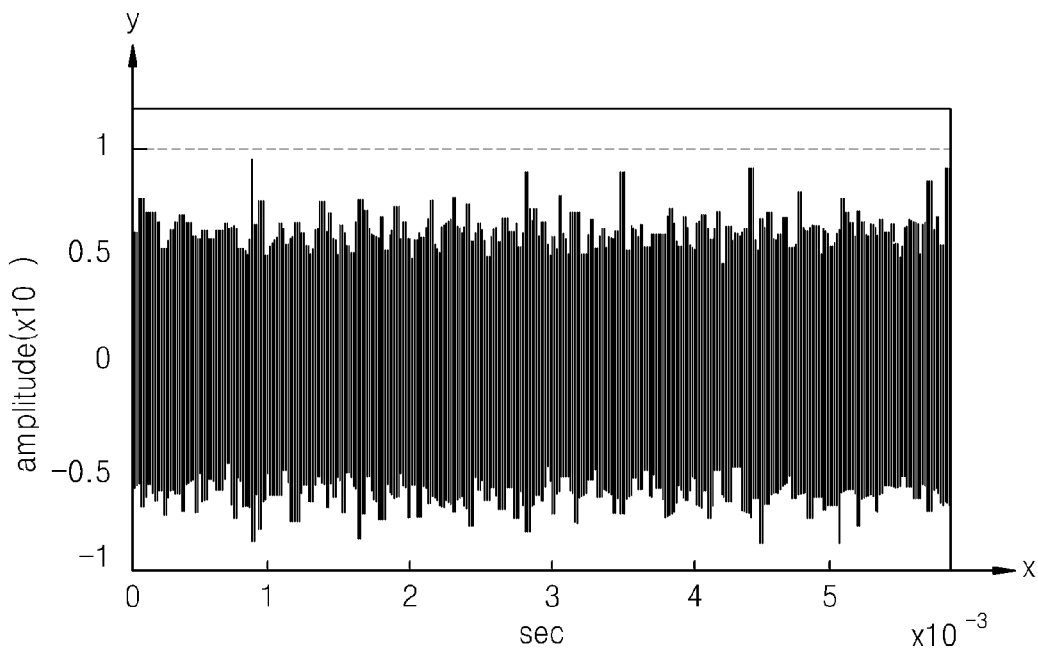

FIGS. 3A and 3B are graphs for explaining oscillation that occurs during sigma-delta modulation.

FIG. 3A is a graph for explaining oscillation that occurs in a low frequency band. FIG. 3B is a graph for explaining oscillation that occurs in a high frequency band.

Referring to FIG. 3A, an X axis indicates time, and a y axis indicates an amplitude of oscillation. If sigma-delta modulation is performed on an input audio signal having a predetermined level in the low frequency band, an intensity of oscillation rapidly increases over time.

Referring to FIG. 3B, an X axis indicates time, and a y axis indicates an amplitude of oscillation. If sigma-delta modulation is performed on an input audio signal having a predetermined level in the high frequency band, oscillation proceeds at regular amplitude without a rapid increase.

Referring to FIGS. 3A and 3B, the intensity of oscillation differs according to frequency bands with respect to the input audio signal having the same signal level. More specifically, in FIG. 3A, amplitude of oscillation rapidly increases after a time t1 and exceeds a range of −1*100000 and 1*100000 in a low frequency region, whereas the amplitude of oscillation is generally between the range of −1*100000 and 1*100000 in a high frequency region.

Therefore, input audio signals having the same signal level show that an intensity of oscillation for each frequency band differs, and amplitude of oscillation further increases in a low frequency region.

Figure 4:
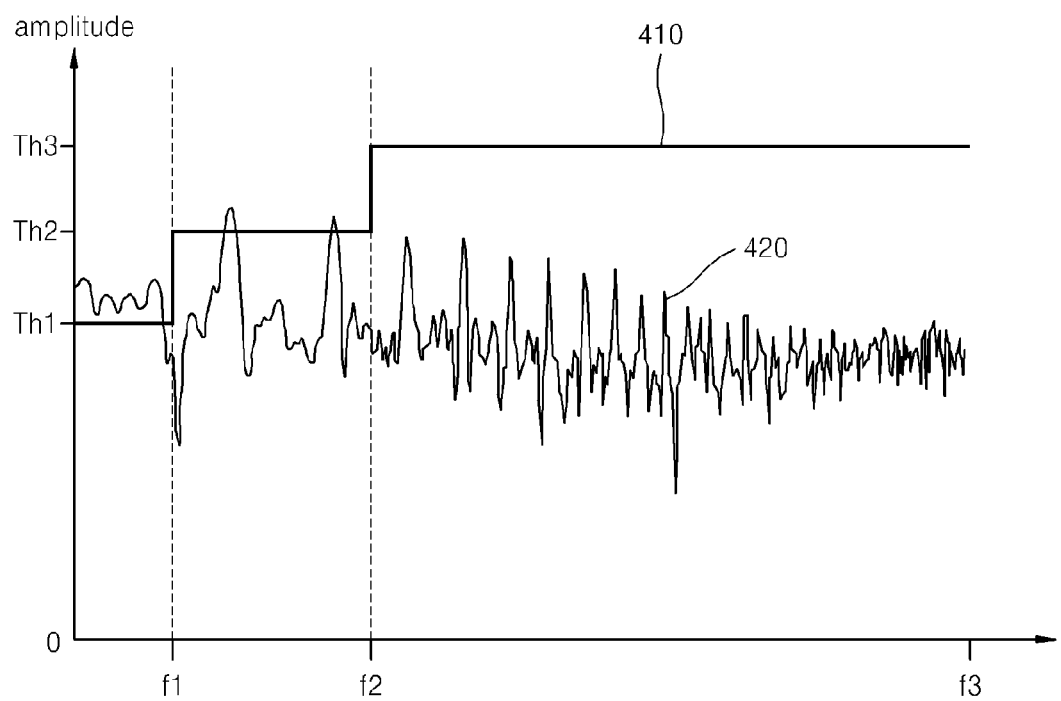
FIG. 4 is a graph for explaining a threshold value for each frequency band used in an audio signal processing apparatus according to an exemplary embodiment.

FIG. 4 is a graph for explaining a threshold value for each frequency band used in an audio signal processing apparatus according to an exemplary embodiment.

The audio signal processing apparatuses 100 and 200 according to exemplary embodiments described above may set a threshold differently according to the sub-frequency bands when determining stability of the input audio signal Sin.

More specifically, the threshold may be set in proportion to frequency values of sub-frequency bands. For example, first through Nth thresholds corresponding to first through Nth sub-frequency bands, respectively, have different values. The higher the frequency values of the sub-frequency bands, the higher the corresponding thresholds, and thus the first threshold may have a smallest value, and the Nth threshold may have a greatest value. An example is illustrated in FIG. 4.

Referring to FIG. 4, an x axis indicates a frequency band of an input audio signal 420, and a y axis indicates a value of a threshold 410. In FIG. 4, a frequency band of the input audio signal 420 is divided into first through third sub-frequency bands. The first through third sub-frequency bands may have a same length or different lengths in the X axis.

For example, a first threshold Th1 is set for the first sub-frequency band having 0 through f1 frequency values, a second threshold Th2 is set for the second sub-frequency band having f1 through f2 frequency values, and a third threshold Th3 is set for the third sub-frequency band having f2 through f3 frequency values.

Thus, if a signal level of the input audio signal 420 in the first frequency band is equal to or greater than the first threshold Th1, the input audio signal 420 in the first frequency band may be determined as an unstable signal. On the other hand, if the signal level of the input audio signal 420 in the third frequency band is equal to or greater than the third threshold Th3, the input audio signal 420 in the third frequency band may be determined as an unstable signal.

Figure 5:
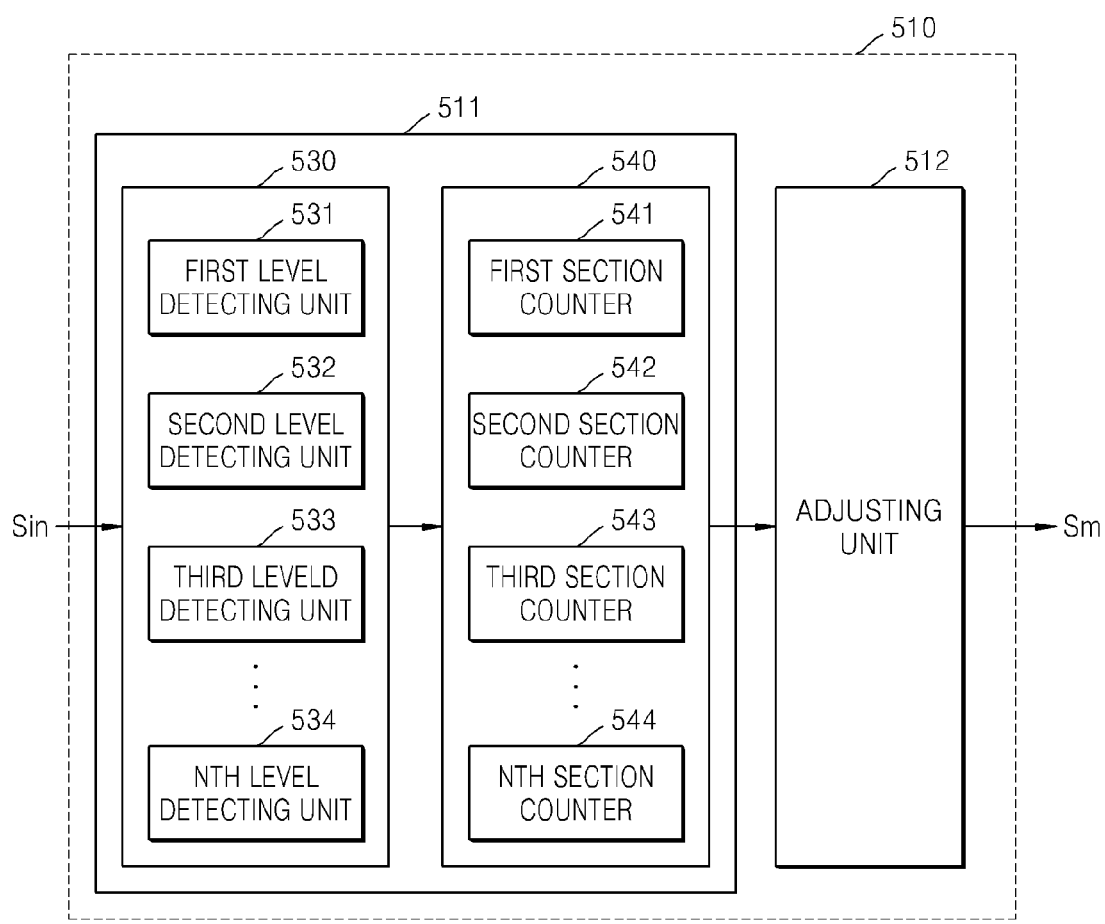
FIG. 5 is a block diagram of a stability determination unit of FIG. 1.

FIG. 5 is a block diagram of a stability determination unit 510 of FIG. 1. The stability determination unit 510 of FIG. 5 may correspond to the stability determination unit 110 of FIG. 1 or the stability determination unit 210 of FIG. 2. A detecting unit 511 and an adjusting unit 512 may correspond to the detecting unit 211 and the adjusting unit 212 of FIG. 2. Thus, redundant descriptions thereof will not be repeated here.

Referring to FIG. 5, the detecting unit 511 may include a signal level detecting unit 530 and a counter unit 540.

The signal level detecting unit 530 divides a frequency band of the input audio signal Sin into a plurality of sub-frequency bands, and compares the input audio signal Sin for each sub-frequency band with a threshold corresponding to the frequency band for a period. In FIG. 5, the frequency band of the input audio signal Sin is divided into first through Nth sub-frequency bands.

More specifically, the signal level detecting unit 530 may include first through Nth level detecting units 531, 532, 533, and 534 that perform a determination operation for respective sub-frequency bands. For example, the first level detecting unit 531 receives the input audio signal Sin and determines whether a level of the input audio signal Sin in a first sub-frequency band is equal to or greater than a first threshold. Such a determination may be performed for a period T1.

The counter unit 540 counts results of determination performed by the signal level detecting unit 530 over the period T1.

More specifically, the counter unit 540 may include first through Nth section counters 541, 542, 543, and 544 that perform counting operations for respective sub-frequency bands. For example, the first section counter 541 may receive the determination result of the first level detecting unit 531 over the period T1, and count the number of times the level of the input audio signal in the first sub-frequency band is equal to or greater than the first threshold. For example, if a counting period of the counter unit 540 is 20*T1, and the number of times the level of the input audio signal Sin in the first sub-frequency band is equal to or greater than the first threshold is 10, the first section counter 541 may transmit the counting number, i.e. 10, to the adjusting unit 512.

The adjusting unit 512 determines stability of the input audio signal Sin according to the counting number output by the counter unit 540. For example, if the number of times the level of the input audio signal Sin in a sub-frequency band is equal to or greater than the corresponding threshold for the sub-frequency band exceeds a threshold rate for the whole counting period, for example, 20% of 20 times, the adjusting unit 512 may determine the input audio signal Sin in the corresponding sub-frequency band to be in an unstable state. In this regard, a reference counting number used to determine the stability of the input audio signal Sin may be set differently according to a product specification such as operation reliabilities of the audio signal processing apparatus.

The adjusting unit 512 may generate the stability determination signal Sm having a first signal level if the input audio signal Sin is determined to be unstable, and may generate the stability determination signal Sm having a second signal level if the input audio signal Sin is determined to be stable.

More specifically, the adjusting unit 512 may determine the stability of the input audio signal Sin for each sub-frequency band, and output the stability determination signal Sm as a first signal level if the adjusting unit 512 determines the input audio signal Sin to be unstable at any one of sub-frequency bands.

The adjusting unit 512 may determine the stability of the input audio signal Sin for each sub-frequency band, and output the stability determination signal Sm as the first signal level only when the adjusting unit 512 determines the input audio signal Sin to be unstable in all of the whole sub-frequency bands.

Alternatively, the adjusting unit 512 may determine the stability of the input audio signal Sin for each sub-frequency band, and output the stability determination signal Sm as the first signal level if the adjusting unit 512 determines the input audio signal Sin to be unstable in one or more sub-frequency bands corresponding to low frequencies.

Figure 6:
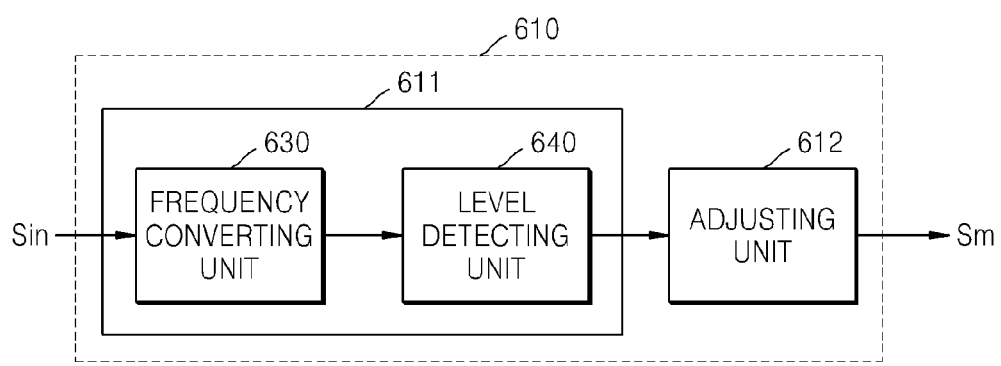
FIG. 6 is a detailed block diagram of a stability determination unit of FIG. 1.

FIG. 6 is a detailed block diagram of a stability determination unit of FIG. 1. The stability determination unit 610 of FIG. 6 may correspond to the stability determination unit 110 of FIG. 1 or the stability determination unit 210 of FIG. 2. A detecting unit 611 and an adjusting unit 612 may correspond to the detecting unit 211 and the adjusting unit 212 of FIG. 2. Thus, redundant descriptions will not be repeated here.

Referring to FIG. 6, the detecting unit 611 may include a frequency converting unit 630 and a level detecting unit 640.

The frequency converting unit 630 converts the input audio signal Sin into a frequency band signal. More specifically, the frequency converting unit 630 may perform fast Fourier transformation (FFT) on the input audio signal Sin. More specifically, the frequency converting unit 630 converts a number of designated samples into frames and performs FFT on the input audio signal Sin for each frame. The frequency converting unit 630 may transmit frequency spectrum information generated by performing the FFT to the level detecting unit 640. The frequency spectrum information is information regarding a level of the input audio signal Sin for each frequency, and thus if the input audio signal Sin is converted into the frequency band signal, the level of the input audio signal Sin for each frequency may be recognized.

The level detecting unit 640 compares the level of the input audio signal Sin for each sub-frequency band with a corresponding threshold for the sub-frequency band by using the frequency band signal converted from the input audio signal Sin by the frequency converting unit 630.

The adjusting unit 612 receives a comparison result for each sub-frequency band from the level detecting unit 640, determines stability of the input audio signal Sin, and generates the stability determination signal Sm having a first or second level. In this regard, the operation of the adjusting unit 612 is the same as that of the adjusting unit 512 of FIG. 5, and thus a detailed description thereof will be omitted here. While a first and second level are described, one of ordinary skill in the art will appreciate that more than two levels may be used.

Figure 7:
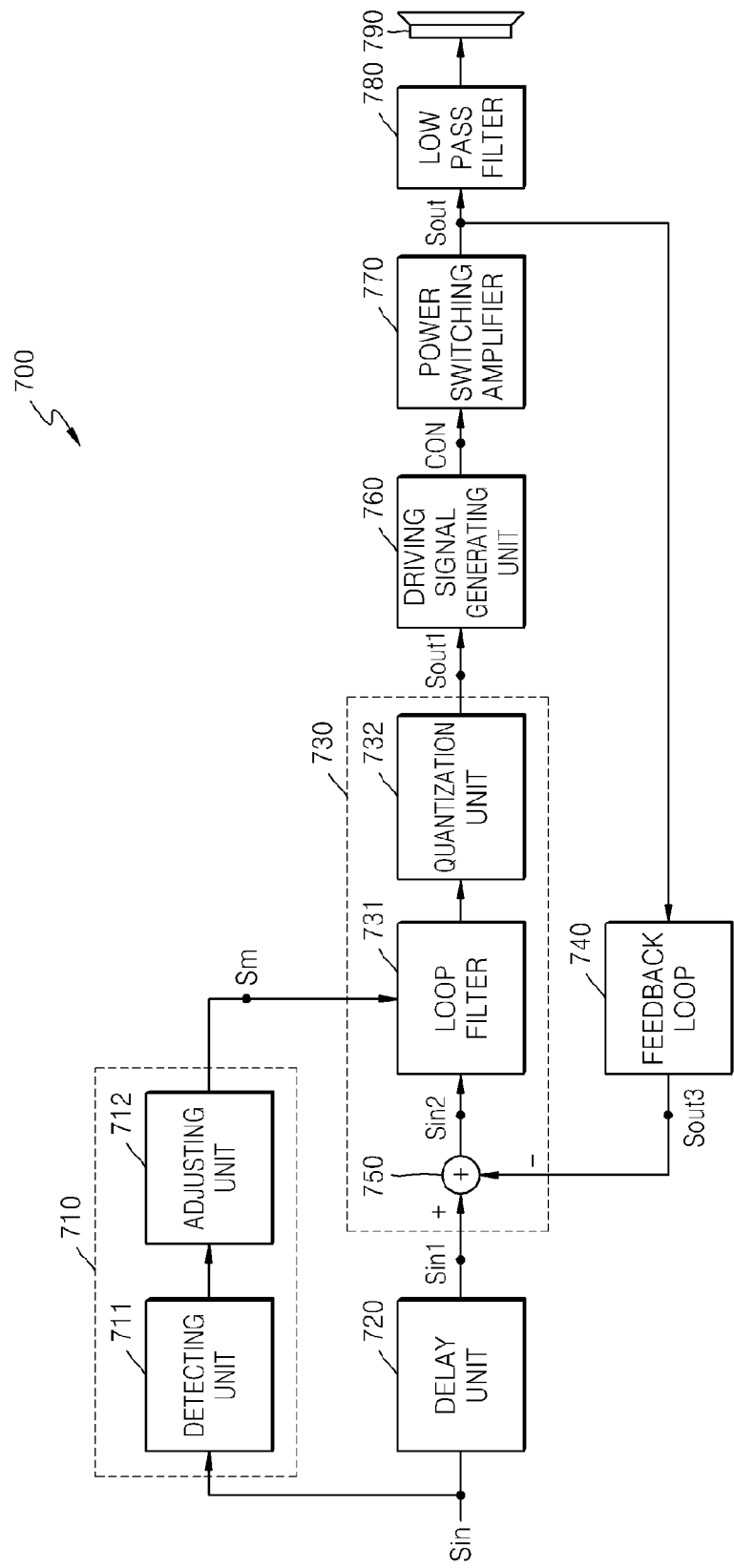
FIG. 7 is a block diagram of an audio signal processing apparatus according to another exemplary embodiment.

FIG. 7 is a block diagram of an audio signal processing apparatus according to another exemplary embodiment.

Referring to FIG. 7, in addition to the elements of the audio signal processing apparatus of FIG. 2, the audio signal processing apparatus 700 may further include at least one of a feedback loop 740, a driving signal generating unit 760, a power switching amplifier 770, a low pass filter 780, and a speaker unit 790. A stability determining unit 710 and a sigma-delta modulation unit 730 of the audio signal processing apparatus 700 may correspond to the stability determining units 110 and 210, and the sigma-delta modulation units 130 and 230 of the audio signal processing apparatuses 100 and 200 of FIGS. 1 and 2, respectively. A delay unit 720 of the audio signal processing apparatus 700 may correspond to the delay unit 220 of FIG. 2. Thus, redundant descriptions thereof will not be repeated here.

The driving signal generating unit 760 receives the first modulation signal Sout1, and generates at least one driving signal CON for controlling a switching amplifying operation according to the input audio signal Sin and the first modulation signal Sout1. In this regard, the switching amplifying operation is performed by using at least one switching device (not shown) included in the power switching amplifier 770. The driving signal CON is a switching control signal used to control the switching device (not shown) to be turned on or off. The driving signal CON is transmitted to the power switching amplifier 770.

The power switching amplifier 770 performs the switching amplifying operation and includes at least one switching device (not shown) that turns on or off in response to the driving signal CON. The power switching amplifier 770 outputs an amplified audio signal Sout corresponding to the input audio signal Sin by using the switching device (not shown).

In this regard, the amplifying audio signal Sout may be a signal obtained by amplifying the amplitude of the first modulation signal Sout1. For example, the power switching amplifier 770 may amplify the first modulation signal Sout1 in such a way that the audio signal Sin input to the audio signal processing apparatus 700 may be output in accordance with a regular maximum output.

The switching device (not shown) included in the power switching amplifier 770 may include at least one of a gallium nitride (GaN) transistor, a gallium arsenide (GaAs) transistor, and a silicon carbide (SiC) transistor.

The gallium nitride (GaN) transistor and the gallium arsenide (GaAs) transistor have a short propagation delay and operate at high speed at a high voltage. In this regard, the propagation delay indicates a time taken to input the driving signal CON that turns a corresponding transistor on to a gate of the transistor and to output a saturated voltage signal to a source end or a drain end that is an output end of the transistor.

If the power switching amplifier 770 uses the gallium nitride (GaN) transistor or the gallium arsenide (GaAs) transistor as the switching device that performs the switching amplifying operation, the power switching amplifier 770 may perform a switching operation at high speed. Accordingly, switching noise may be minimized, thereby reducing an SNR of the audio signal processing apparatus 700. Furthermore, a signal may be quickly amplified at a high voltage, thereby increasing a maximum output of the audio signal processing apparatus 700.

The gallium nitride (GaN) transistor used as the switching device may be a heterojunction field effect transistor (HFET).

The detailed construction of the power switching amplifier 770 will be described with reference to FIG. 8 later.

The low pass filter 780 demodulates and outputs the amplifying audio signal Sout output from the power switching amplifier 770 as an analog audio signal. That is, the signal output from the power switching amplifier 770 is a digital signal in a pulse form and then is converted into an analog signal and output.

The speaker unit 790 converts and outputs the output signal from the low pass filter 780 as a physical vibration signal audibly recognized by a user.

The feedback loop 740 feeds back the amplifying audio signal Sout and transmits the amplifying audio signal Sout and a signal Sout3 to an input end of the sigma-delta modulation unit 730 in order to optimize a gain and a phase of the amplifying audio signal Sout in accordance with a regular output or a target gain and a target phase of the audio signal processing apparatus 700.

If the audio signal processing apparatus 700 includes the feedback loop 740, the summing unit 750 subtracts the second feedback signal Sout3 from the input audio signal Sin and outputs the adjusted input audio signal Sin2 to the loop filter 731. If the audio signal processing apparatus 700 includes the delay unit 720, the summing unit 750 subtracts the second feedback signal Sout3 from the delayed input audio signal Sin1 and outputs subtracted signal by the summing unit 750 to the loop filter 731.

More specifically, the feedback loop 740 may attenuate the amplifying audio signal Sout by a predetermined rate, delay the amplifying audio signal Sout for a period of time, and output the second feedback signal Sout3.

Figure 8A:
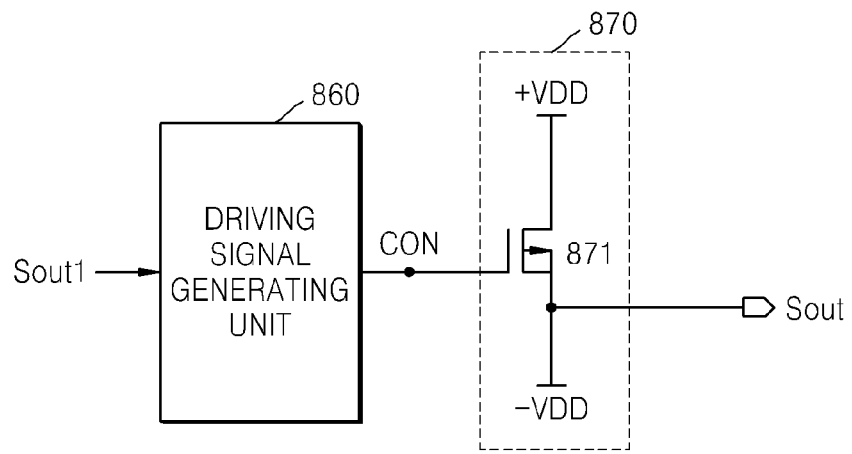
FIGS. 8A and 8B are detailed diagrams of a power switching amplifier of FIG. 7.
Figure 8B:
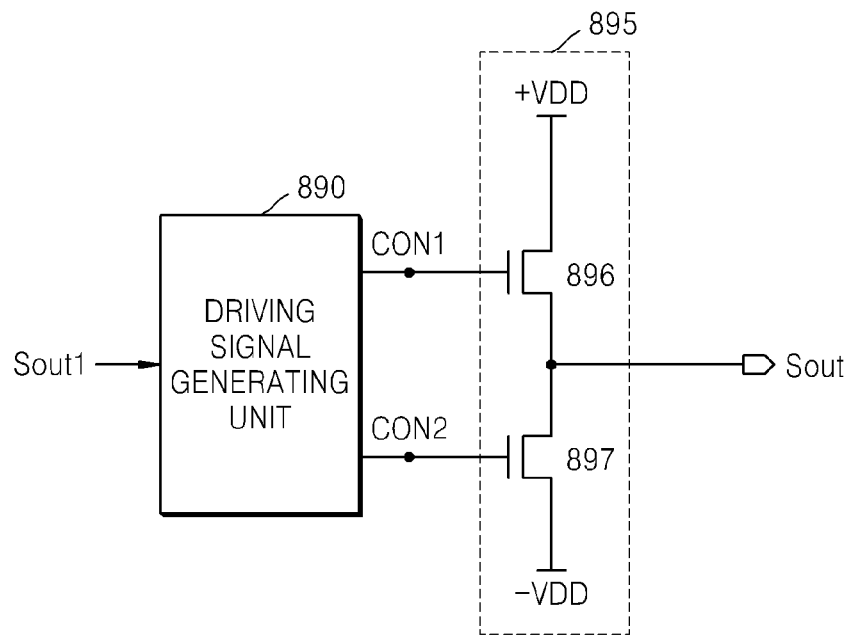

FIGS. 8A and 8B are detailed diagrams of the power switching amplifier 770 of FIG. 7. FIG. 8A shows an example of the power switching amplifier 770 of FIG. 7. FIG. 8B shows another example of the power switching amplifier 770 of FIG. 7. Driving signal generating units 860 and 890 of FIGS. 8A and 8B correspond to the driving signal generating unit 760 of FIG. 7, and thus detailed descriptions thereof will be omitted here.

Referring to FIG. 8A, a power switching amplifier 870 may include a switching device 871 similar to the switching device described above. The switching device 871 may include at least one of a gallium nitride (GaN) transistor, a gallium arsenide (GaAs) transistor, and a silicon carbide (SiC) transistor.

A high power voltage +VDD and a low power voltage −VDD are supplied to one end and another end of the switching device 871, and the driving signal CON is input into a gate terminal thereof. The switching device 871 outputs the amplifying audio signal Sout that is a voltage signal having a high power voltage +VDD level and a low power voltage −VDD level in response to the driving signal CON.

Referring to FIG. 8B, the driving signal generating unit 890 may generate a first driving signal CON1 and a second driving signal CON2. In this regard, the second driving signal CON2 may be the inverted first driving signal CON1.

A power switching amplifier 895 may include a first switching device 896 and a second switching device 897 that are connected in series to each other. If the first switching device 896 is turned on, the high power voltage +VDD is driven. If the second switching device 897 is turned on, the low power voltage −VDD is driven.

Figure 9:
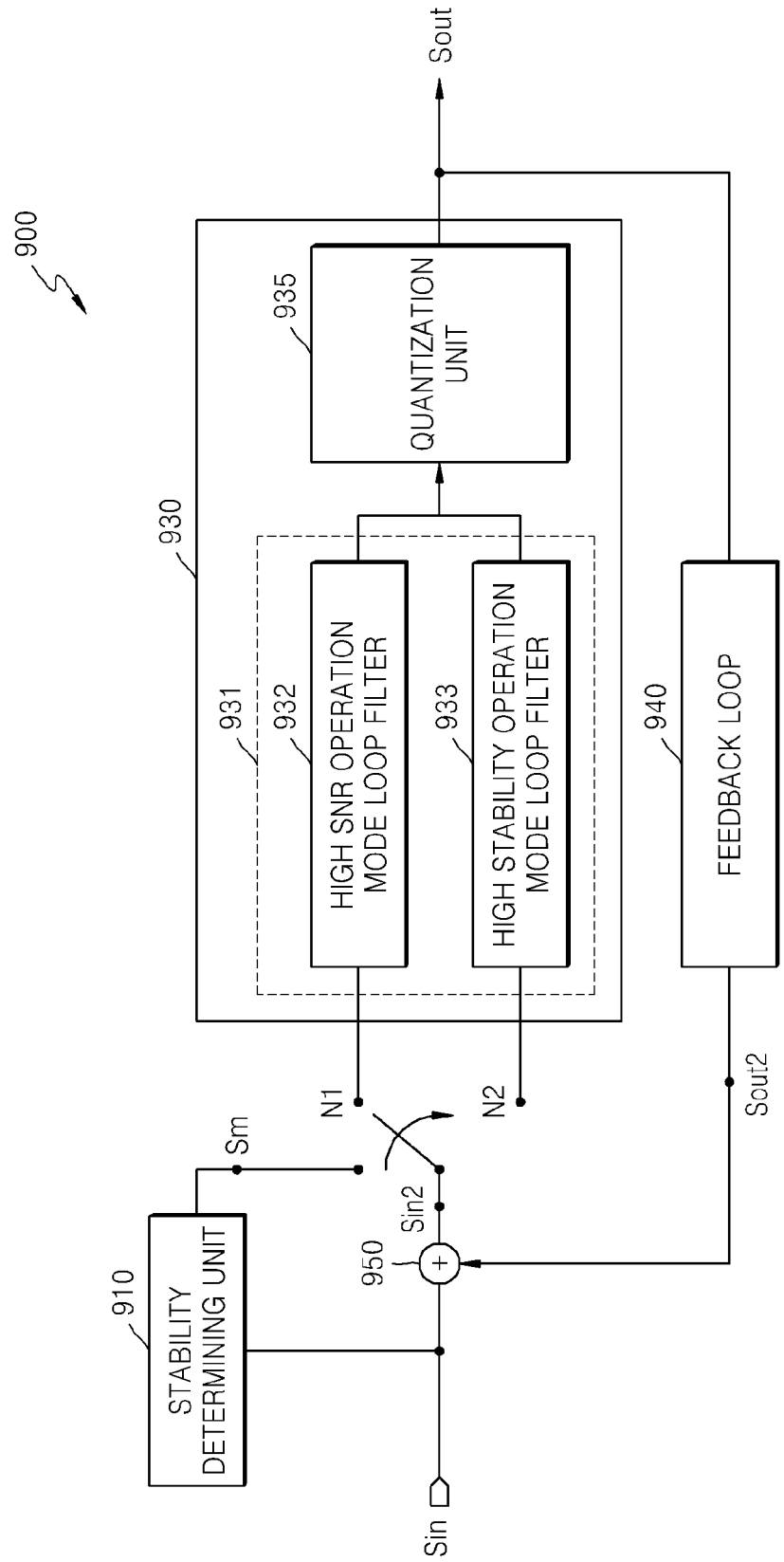
FIG. 9 is a block diagram of an audio signal processing apparatus according to another exemplary embodiment.

FIG. 9 is a block diagram of an audio signal processing apparatus 900 according to another exemplary embodiment.

Referring to FIG. 9, the audio signal processing apparatus 900 may correspond to the audio signal processing apparatus 200 of FIG. 2. More specifically, a stability determining unit 910 and a sigma-delta modulation unit 930 of the audio signal processing apparatus 900 may correspond to the stability determining unit 210 and the sigma-delta modulation unit 230 of the audio signal processing apparatus 200 of FIG. 2. Thus, redundant descriptions will not be repeated here. Furthermore, the audio signal processing apparatus 900 does not include an element corresponding to the delay unit 220 of FIG. 2 and thus a summing unit 950 of the sigma-delta modulation unit 930 directly receives the input audio signal Sin.

The stability determining unit 910 may generate the stability determination signal Sm that is used to adjust at least one of an SNR value and a stability value of the sigma-delta modulation unit 930 according to a comparison result of a level of the input audio signal Sin for each sub-frequency band and a threshold for each sub-frequency band as described above.

For example, the stability determining unit 910 may determine the input audio signal Sin to be unstable according to the comparison result, output the stability determination signal Sm of a first level, and control the sigma-delta modulation unit 930 in such a way that the SNR of the sigma-delta modulation unit 930 is maintained or reduced, and the stability value of sigma-delta modulation increases. That is, the stability determining unit 910 may control the sigma-delta modulation unit 930 in such a way that oscillation that occurs during sigma-delta modulation is reduced.

As another example, the stability determining unit 910 may determine the input audio signal Sin to be stable according to the comparison result, output the stability determination signal Sm of a second level, and control the sigma-delta modulation unit 930 in such a way that the SNR of the sigma-delta modulation unit 930 increases, and the stability value of sigma-delta modulation is maintained or reduced.

Alternatively, the stability determining unit 910 may generate the stability determination signal Sm to adjust at least one of a coefficient of a NTF and an order of the sigma-delta modulation unit 930 according to the comparison result of the level of the input audio signal Sin for each sub-frequency band and the threshold for each sub-frequency band as described above.

The loop filter 931 may operate during a high SNR operation mode 932 and a high stability operation mode 933 according to control of the stability determination signal Sm. That is, the stability determination signal Sm may be used to control whether the signal Sin2 is fed into the high SNR operation mode loop filter 932 or the high stability operation mode loop filter 933 of the loop filter 930.

More specifically, if the stability determination signal Sm of the second level is transmitted from the stability determination unit 910, the adjusted input audio signal Sin2 is switched so as to be transmitted to an N1 node. Accordingly, the loop filter 931 may operate as the loop filter 932 having a high SNR. If the stability determination signal Sm of the first level is transmitted from the stability determination unit 910, the adjusted input audio signal Sin2 is switched so as to be transmitted to an N2 node. Accordingly, the loop filter 931 may operate as the loop filter 932 having high stability.

The sigma-delta modulation unit 930 may receive the stability determination signal Sm of the first level, and adjust at least one of the coefficient of the NTF and the order of the sigma-delta modulation unit 930 in such a way that the SNR value of the sigma-delta modulation unit 930 is reduced. Alternatively, the sigma-delta modulation unit 930 may adjust at least one of the coefficient of the NTF and the order of the sigma-delta modulation unit 930 in such a way that oscillation of the sigma-delta modulation unit 930 is reduced.

Furthermore, the sigma-delta modulation unit 930 may receive the stability determination signal Sm of the second level, and adjust at least one of the coefficient of the NTF and the order of the sigma-delta modulation unit 930 in such a way that the SNR value of the sigma-delta modulation unit 930 increases.

For example, the stability determining unit 910 determines the input audio signal Sin to be unstable according to the comparison result, and outputs the stability determination signal Sm of the first level. The sigma-delta modulation unit 930 may adjust the coefficient of the NTF of the of the sigma-delta modulation unit 930 in such a way that the order of the sigma-delta modulation unit 930 is reduced or oscillation that occurs during sigma-delta modulation is reduced in response to the stability determination signal Sm of the first level.

As another example, the stability determining unit 910 determines the input audio signal Sin to be stable according to the comparison result and outputs the stability determination signal Sm of the second level. The sigma-delta modulation unit 930 may adjust the coefficient of the NTF of the of the sigma-delta modulation unit 930 in such a way that the order of the sigma-delta modulation unit 930 increases or the SNR value of the sigma-delta modulation unit 930 increases in response to the stability determination signal Sm of the second level.

A quantization unit 935, a feedback loop 940, and a summing unit 950 correspond to the quantization unit 232, the feedback loop 240, and the summing unit 250 of FIG. 2, respectively, and thus detailed descriptions thereof will not be provided here.

Figure 10:
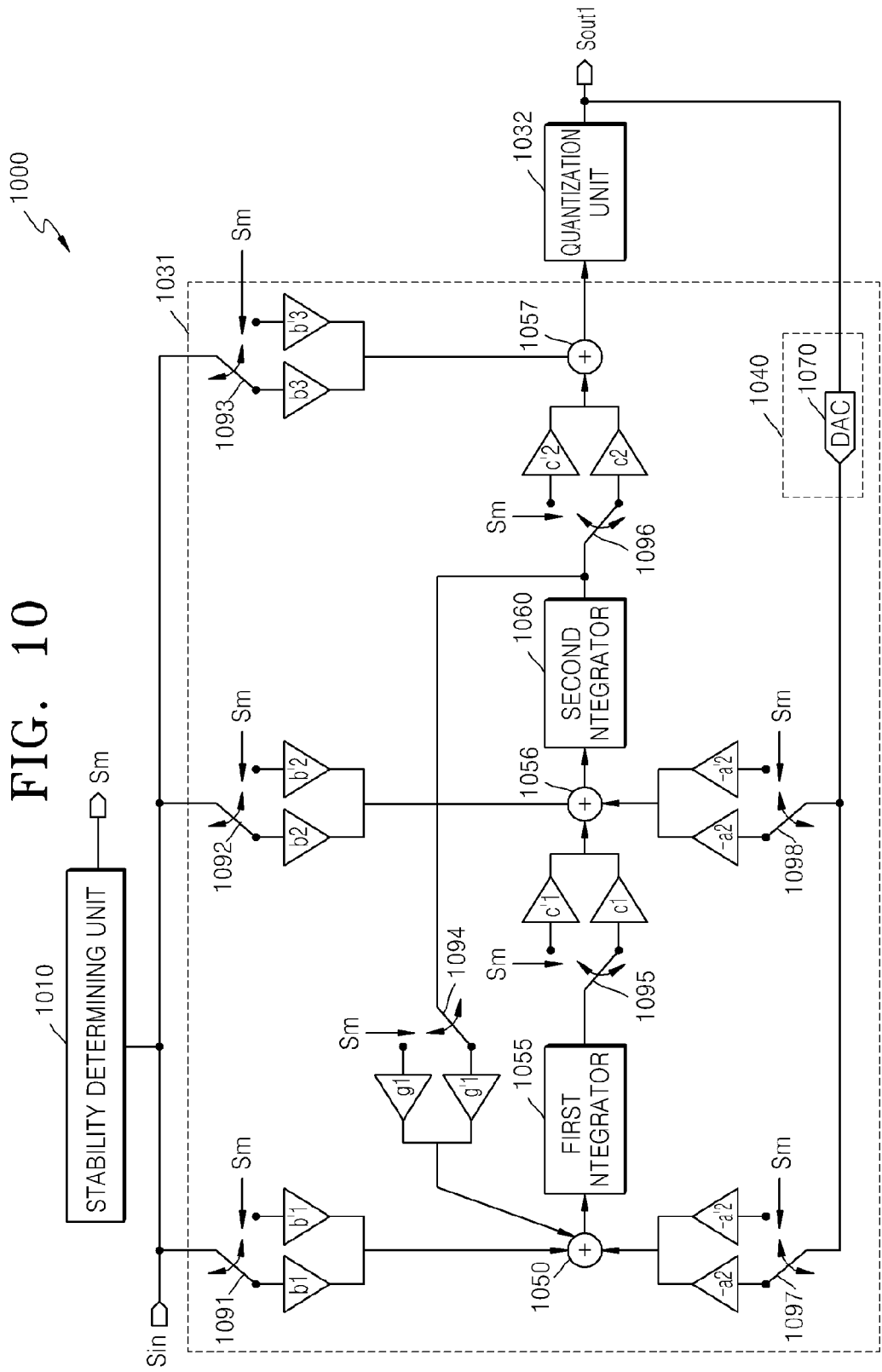
FIG. 10 is a detailed diagram of a sigma-delta modulation unit of FIG. 2.

FIG. 10 is a detailed diagram of a sigma-delta modulation unit of FIG. 2.

The sigma-delta modulation unit 1000, a loop filter 1031, a quantization unit 1032, a feedback loop 1040, and a summing unit 1050 of FIG. 10 correspond to the sigma-delta modulation unit 230, the loop filter 231, the quantization unit 232, the feedback loop 240, and the summing unit 250 of FIG. 2, and thus redundant descriptions will be omitted here.

The loop filter 1031 may operate during the high SNR operation mode 932 and the high stability operation mode 933 in the same manner as the loop filter 931 of FIG. 9. Thus, a redundant description thereof will be omitted here.

Referring to FIG. 10, the loop filter 1031 may further include a first integrator 1055 and a second integrator 1060 for integrating the input audio signal Sin, a plurality of coefficients b1, b2, b3, g1, c1, c2, −a1, −a2, and b'1, b'2, b'3, g'1, c'1, c'2, −a'1, and −a'2, and a plurality of summing units 1050, 1056, and 1057 for summing signals. In this regard, the coefficients may be those of the NTF used for sigma-delta modulation. FIG. 10 shows the 2-level sigma-delta modulator 1000 including two integrators. However, one of ordinary skill in the art will understand that only one integrator may be provided, or a number of integrators greater than 2 may be provided.

Referring to FIG. 10, the coefficients b1, b2, b3, g1, c1, c2, −a1, and −a2 are those of the NTF used to achieve high stability of the sigma-delta modulation unit 1000. That is, the coefficients b1, b2, b3, g1, c1, c2, −a1, and −a2 may be designed to achieve a low oscillation rate of the sigma-delta modulation unit 1000.

The coefficients b'1, b'2, b'3, g'1, c'1, c'2, −a'1, and −a'2 are those of the NTF used to achieve a high SNR of the sigma-delta modulation unit 1000.

The loop filter 1031 may include a plurality of switches 1091, 1092, 1093, 1094, 1095, 1096, 1097, and 1098 for selecting any one of the coefficients to achieve high stability of the sigma-delta modulation unit 1000 and the high SNR of the sigma-delta modulation unit 1000 in response to the stability determination signal Sm.

For example, if the stability determination signal Sm of a first level is transmitted from a stability determining unit 1010, the switches 1091, 1092, 1093, 1094, 1095, 1096, 1097, and 1098 are switched in such a way that the coefficients b1, b2, b3, g1, c1, c2, −a1, and −a2 used to achieve the high stability of the sigma-delta modulation unit 1000 are applied in the loop filter 1031.

Furthermore, if the stability determination signal Sm of a second level is transmitted from the stability determining unit 1010, the switches 1091, 1092, 1093, 1094, 1095, 1096, 1097, and 1098 are switched in such a way that the coefficients b'1, b'2, b'3, g'1, c'1, c'2, −a'1, and −a'2 used to achieve the high SNR of the sigma-delta modulation unit 1000 are applied in the loop filter 1031.

In FIG. 10, the feedback loop 1040 includes a digital to analog converter 1070. The first modulation signal Sout1 output from the quantization unit 1032 is a pulse signal in a digital signal form. The input audio signal Sin may be in an analog signal form. Thus, the first modulation signal Sout1 is converted into a signal in an analog signal form and output to the summing unit 1050 so that the summing unit 1050 may easily sum or subtract signals.

The sigma-delta modulation unit 1000 adjusts values of the coefficients used for sigma-delta modulation according to control of the stability determining unit 1010 and thus may operate in a high SNR operation mode or a high stability operation mode.

Figure 11:
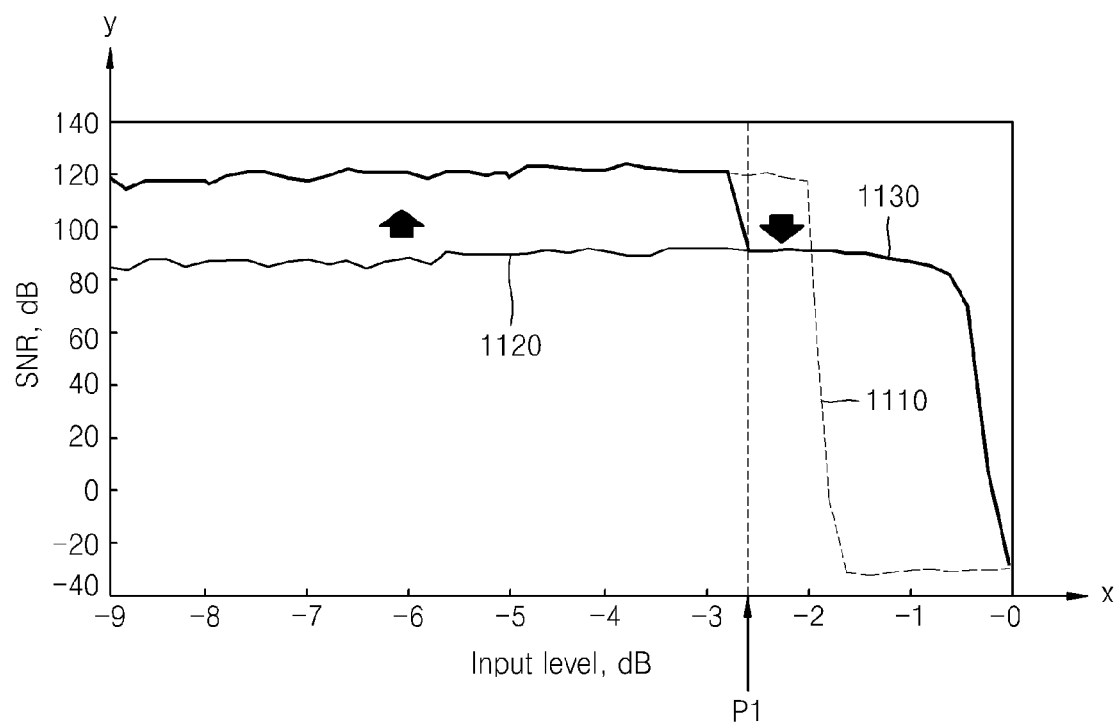
FIG. 11 is a graph for explaining an operation of an audio signal processing apparatus according to an exemplary embodiment.

FIG. 11 is a graph for explaining an operation of an audio signal processing apparatus according to an exemplary embodiment.

Referring to FIG. 11, an x axis indicates a signal level of the input audio signal Sin in a decibel (dB) unit, and a y axis indicates a SNR thereof in the decibel (dB) unit.

A curve 1110 is a characteristic curve designed to have a high SNR. A curve 1120 is a characteristic curve designed to have high stability.

Referring to the curve 1110, a high SNR is maintained until a level of the input audio signal Sin has a level P1, and is rapidly reduced due to oscillation that occurs during sigma-delta modulation if the level of the input audio signal Sin exceeds the level P1. Thus, if the level of the input audio signal Sin increases, stability of a system may not be secured.

Referring to the curve 1120, even if the level of the input audio signal Sin increases, although the SNR is continuously maintained at the level P1, the maintained SNR has a low value.

The audio signal processing apparatus according to exemplary embodiments drives a sigma-delta modulation unit to have a high SNR until the level of the input audio signal Sin does not exceed the level P1, and prevents oscillation from occurring if the level of the input audio signal Sin exceeds the level P1 and thus sigma-delta modulation may be stably performed.

Accordingly, the audio signal processing apparatus according to exemplary embodiments may secure a maximum SNR while securing operation stability during sigma-delta modulation.

Figure 12:
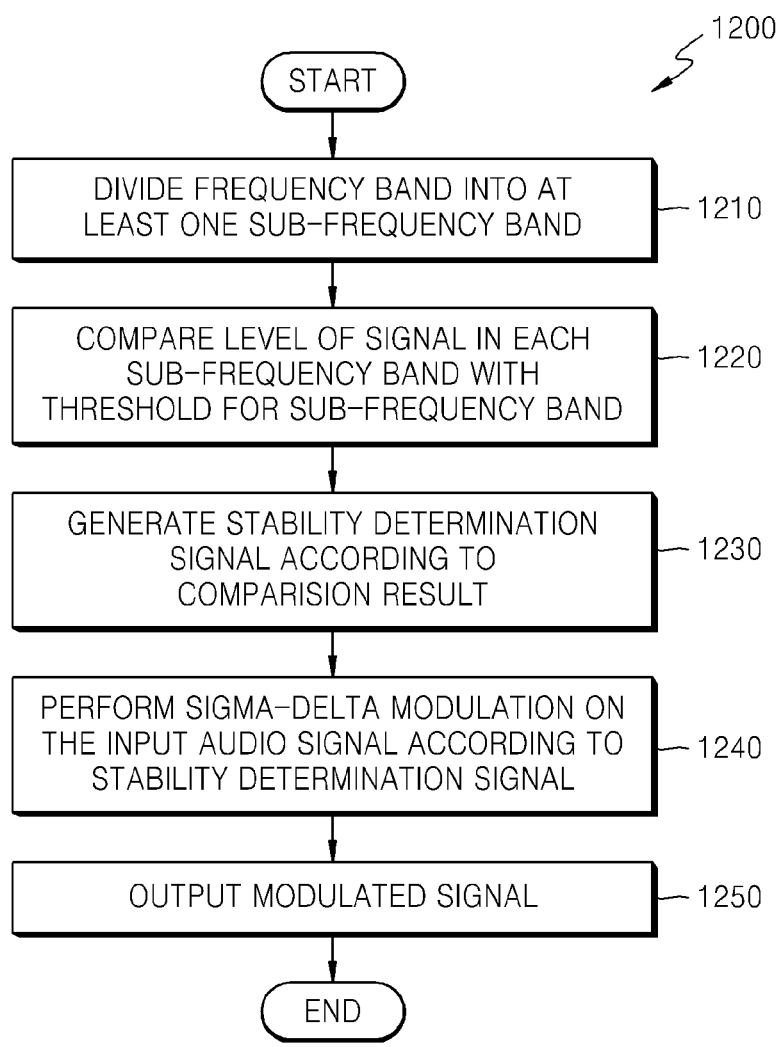
FIG. 12 is a flowchart of an audio signal processing method according to an exemplary embodiment.

FIG. 12 is a flowchart of an audio signal processing method 1200 according to an exemplary embodiment. The audio signal processing method 1200 may be performed by an audio signal processing apparatus according to any of the exemplary embodiments described above.

Referring to FIG. 12, the audio signal processing method 1200 divides a frequency band of the input audio signal Sin into at least one sub-frequency band (operation 1210), compares a level of the input audio signal Sin for each sub-frequency band with a threshold for the sub-frequency band (operation 1220), and generates the stability determination signal Sm according to a comparison result (operation 1230). Operations 1210-1230 may be performed by a stability determining unit (for example, stability determining unit 110).

If the level of the input audio signal Sin in at least one sub-frequency band is equal to or greater than the threshold, the input audio signal Sin may be determined to be unstable. If the input audio signal Sin is determined to be unstable, the stability determination signal Sm may be generated as a signal of a first level.

Sigma-delta modulation is performed on the input audio signal Sin (operation 1240), and the first modulation signal Sout1 is output according to the stability determination signal Sm generated in operation 1210 (operation 1250).

The audio signal processing method 1200 may further include adjusting (not shown) at least one of a coefficient of an NTF applied during sigma-delta modulation and a level of sigma-delta modulation according to the comparison result of operation 1220.

The audio signal processing method 1200 of FIG. 12 corresponds to the operations described above and performed by the audio signal processing apparatuses described with reference to FIGS. 1 and 11. Thus, redundant descriptions thereof are omitted.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims.

What is claimed is:

1. An audio signal processing apparatus comprising:
a stability determining circuit that compares a level of an input audio signal for each of at least one sub-frequency band with a threshold for the sub-frequency band, and generates a stability determination signal according to a result of the comparisons; and
a sigma-delta modulator that sigma-delta modulates the input audio signal according to the stability determination signal, and outputs a first modulation signal.

2. The apparatus of claim 1, wherein each of the at least one sub-frequency band has a different threshold which is set for each sub-frequency band as a value in proportion to a frequency value of the one sub-frequency band.

3. The apparatus of claim 2, further comprising:
a delay circuit that receives the input audio signal, compensates the input audio signal for a time taken to determine stability in the stability determining circuit, and outputs the compensated input audio signal to the sigma-delta modulator.

4. The apparatus of claim 2, wherein the stability determining circuit determines the input audio signal in a sub-frequency band to be unstable if a level of the input audio signal in the sub-frequency band is equal to or greater than the threshold for the sub-frequency band, and sets a level of the stability determination signal to indicate that the input audio signal is unstable.

5. The apparatus of claim 2, wherein the stability determining circuit comprises:
a detecting circuit that divides a frequency band of the input audio signal into the at least one sub-frequency band, and compares the level of the input audio signal for each of the at least one sub-frequency band with the threshold for the sub-frequency band; and
an adjusting circuit that determines stability of the input audio signal and generates the stability determination signal according to the result of the comparisons.

6. The apparatus of claim 5, wherein the detecting circuit comprises:
a signal level detecting circuit that divides the frequency band of the input audio signal into a plurality of sub-frequency bands, and compares the input audio signal for each of the plurality of sub-frequency bands with the threshold for the sub-frequency band for a period; and
a counter circuit that accumulates a result of the comparison over the period.

7. The apparatus of claim 5, wherein the detecting circuit comprises:
a frequency converting circuit that converts the input audio signal into a frequency band signal; and
a level detecting circuit that compares the level of the input audio signal for each of the at least one sub-frequency band with the threshold for the sub-frequency band by using the frequency band signal.

8. The apparatus of claim 2, wherein the sigma-delta modulator comprises:
a loop filter that integrates the input audio signal and outputs the integrated input audio signal; and
a quantization circuit that quantizes the output signal of the loop filter and generates the first modulation signal.

9. The apparatus of claim 8, wherein the sigma-delta modulator further comprises:
a feedback loop that feeds back the first modulation signal and outputs a first feedback signal; and
a summing circuit that subtracts the first feedback signal from the input audio signal and outputs the subtracted input audio signal.

10. The apparatus of claim 2, further comprising:
a driving signal generating circuit that generates at least one driving signal used to control a switching amplifying operation according to the first modulation signal; and
a power switching amplifier comprising at least one switching device that turns on or off in response to a corresponding one of the at least one driving signal, performing the switching amplifying operation, and outputting an amplified audio signal corresponding to the input audio signal by using the at least one switching device,
wherein the at least one switching device comprises at least one of a gallium nitride (GaN) transistor, a gallium arsenide (GaAs) transistor, and a silicon carbide (SiC) transistor.

11. The apparatus of claim 10, further comprising:
a feedback loop that outputs a feedback signal obtained by attenuating and delaying the amplified audio signal to the sigma-delta modulator in order to compensate for at least one of a delay and a gain of the amplified audio signal.

12. The apparatus of claim 1, wherein the stability determining circuit generates the stability determination signal such that at least one of a signal-to-noise ratio (SNR) value and a stability value of the sigma-delta modulator is adjusted according to the result of the comparison.

13. The apparatus of claim 1, wherein the stability determining circuit generates the stability determination signal such that at least one of a coefficient of a noise transfer function (NTF) of the sigma-delta modulator and an order of the sigma-delta modulator is adjusted according to the result of the comparison.

14. The apparatus of claim 1, wherein the stability determining circuit generates the stability determination signal of a first level if the level of the input audio signal in a sub-frequency band of the at least one sub-frequency band is equal to or greater than the threshold for the sub-frequency band, and generates the stability determination signal of a second level if the level of the input audio signal in the sub-frequency band is less than the threshold for the sub-frequency band.

15. The apparatus of claim 14, wherein the sigma-delta modulator receives the stability determination signal of the first level and adjusts at least one of a coefficient of a noise transfer function (NTF) of the sigma-delta modulator and an order of the sigma-delta modulator such that oscillation that occurs during sigma-delta modulation is reduced.

16. The apparatus of claim 14, wherein the sigma-delta modulator receives the stability determination signal of the second level and adjusts at least one of a coefficient of a noise transfer function (NTF) of the sigma-delta modulator and an order of the sigma-delta modulator such that a signal-to-noise ratio (SNR) value of the sigma-delta modulator increases.

17. An audio signal processing method comprising:
dividing a frequency band of an input audio signal into at least one sub-frequency band;
comparing a level of the input audio signal for each of the at least one sub-frequency band with a threshold for the sub-frequency band;
generating a stability determination signal according to a result of the comparing;
performing sigma-delta modulation on the input audio signal according to the stability determination signal; and outputting the sigma-delta modulated signal as a first modulation signal.

18. The method of claim 17, wherein each of the at least one sub-frequency band has a different threshold which is set for each sub-frequency band as a value in proportion to a frequency value of the sub-frequency band.

19. The method of claim 17, wherein the generating of the stability determination signal comprises:
determining the input audio signal to be unstable if a level of the input audio signal is equal to or greater than the threshold for the sub-frequency band.

20. The method of claim 17, wherein the outputting of the first modulation signal comprises:
adjusting at least one of a coefficient of a noise transfer function (NTF) applied during sigma-delta modulation and an order of sigma-delta modulation according to the result of the comparing.

21. An audio signal processing apparatus comprising:
a stability determining circuit that divides an audio signal into a plurality of sub-frequency bands, compares a level of the audio signal for each sub-frequency band with a threshold for the sub-frequency band, and generates a stability determination signal according to a result of the comparisons; and
a sigma-delta modulator that sigma-delta modulates the audio signal according to the stability determination signal, and outputs a first modulation signal.

22. The apparatus of claim 21, wherein each of the sub-frequency bands has a threshold that is set in proportion to a frequency value of the sub-frequency band.

23. The apparatus of claim 22, wherein the stability determining circuit determines the input audio signal to be unstable if a level of the input audio signal in any one of the sub-frequency bands is equal to or more than the threshold for the frequency band, and sets a level of the stability determination signal to indicate that the input audio signal is unstable.

24. The apparatus of claim 22, wherein the stability determining circuit determines the input audio signal to be unstable if a level of the input audio signal in one or more of the sub-frequency bands is equal to or more than the threshold for the frequency band, and sets a level of the stability determination signal to indicate that the input audio signal is unstable.

25. An audio signal processing method comprising:
dividing a frequency band of an input audio signal into a plurality of sub-frequency bands;
comparing a level of the input audio signal for at least one sub-frequency band with a threshold for the sub-frequency band;
determining the stability of the input audio signal based on a result of the comparison;
performing sigma-delta modulation on the whole of the input audio signal using modulation parameters set according to the determined stability of the input audio signal; and
outputting the sigma-delta modulated signal as a first modulation signal.

26. The method of claim 25, wherein a level of the input audio signal in each of the sub-frequency bands is compared with a threshold for the sub-frequency band, and if the level in any one of the sub-frequency bands is equal to or greater than the threshold for the sub-frequency band, setting first modulation parameters, otherwise setting second modulation parameters which are different than the first modulation parameters.

\* \* \* \* \*